US005637885A

United States Patent [19]
Heinemann et al.

[11] Patent Number: 5,637,885
[45] Date of Patent: Jun. 10, 1997

[54] METHOD FOR PRODUCING A MICROSYSTEM AND FORMING A MICROSYSTEM LASER THEREFROM

[75] Inventors: Stefan Heinemann, München; Axel Mehnert, Schongau; Peter Peuser, Riemerling; Nikolaus Schmitt, München; Helmut Seidel, Starnberg, all of Germany

[73] Assignee: Deutsche Aerospace AG, Germany

[21] Appl. No.: 420,791

[22] Filed: Apr. 7, 1995

Related U.S. Application Data

[63] Continuation of Ser. No. 318,663, filed as PCT/EP93/00830, Apr. 3, 1993, abandoned.

[51] Int. Cl.$^6$ .................. H01L 27/15; H01L 31/12; H01L 31/153; H01L 33/00
[52] U.S. Cl. ................ 257/84; 257/777; 438/128; 438/460
[58] Field of Search .................... 257/685, 686, 257/84, 85, 83, 723, 724, 777, 432; 437/942, 208, 205, 51

[56] References Cited

U.S. PATENT DOCUMENTS 5,051,865  9/1991  Kato ........................................ 257/686
5,434,434  7/1995  Kasahara et al. ........................ 257/84

*Primary Examiner*—Mahshid Saadat
*Assistant Examiner*—S. V. Clark
*Attorney, Agent, or Firm*—Evenson, McKeown, Edwards & Lenahan P.L.L.C.

[57] ABSTRACT

The invention relates to a method for producing a microsystem and from it forming a microsystem laser, which preferably has a vertical structural element by contacting of wafer plates, which carry different functional elements of a system, so that this system on the one hand thus includes heterogeneous functions such as actuators, optics, sensors, cooling systems, micromechanics and electronics, and on the other hand, the wafer carrying these functions permits a relatively homogeneous processing of quite similar functions integrated each on one wafer, so that the complexity of the system is created for the first time for the vertical arrangement of these functions.

6 Claims, 4 Drawing Sheets

METHOD FOR PRODUCING A MICROSYSTEM AND FORMING A MICROSYSTEM LASER THEREFROM

This is a continuation of U.S. application Ser. No. 08/318,663 filed Oct. 9, 1994, now abandoned, which in turn was a National State filing of application PCT/EP 93/00830 filed Apr. 3, 1993.

BACKGROUND AND SUMMARY OF THE INVENTION

The invention relates to a method of making a microsystem such as a microsystem laser, using microelectronics, micromechanical and micro-optical techniques.

Methods for structuring semiconductor materials—such as silicon and gallium arsenide—by anisotropic etching, for instance, are known. In particular, it is possible to produce rather complicated structures in individual wafers in a defined sequence of different treatments. In all the corresponding methods in the prior art, however, the individual heterogeneous components of a microsystem are integrated on a common base, which means that each system has to be manufactured virtually individually. Simultaneous machining of similar components without adjustment or positioning of the individual compartments has not been possible thus far in the prior art, as may be learned for instance from German Patent 39 25 201 and German Patent Application P 40 41 130.3–33. The latter application discloses a method for contacting wafers (or in other words different bonding methods) and so-called optical contacting.

The object of the present invention is to provide a method in which, using known semiconductor batch processing techniques, complex microsystems can be produced that besides the horizontal structures also preferably have vertical structures forming the microsystems, wherein all the wafers are adjusted to one another and contacted to one another, and a parallel and mutually independent functioning of the microsystems is made possible.

This object is achieved according to the invention by joining a stack of wafers made of semiconductor quartz or crystal material, each containing an array of a particular element or elements of a microsystem. The respective wafers are positioned (each as a unit) relative to each other and joined to form an array of vertically structured duplicate microsystems, which may be separated or operated as a planar array.

Other objects, advantages and novel features of the present invention will become apparent from the following detailed description of the invention when considered in conjunction with the accompanying drawings.

DETAILED DESCRIPTION OF THE DRAWINGS

Figure 1:
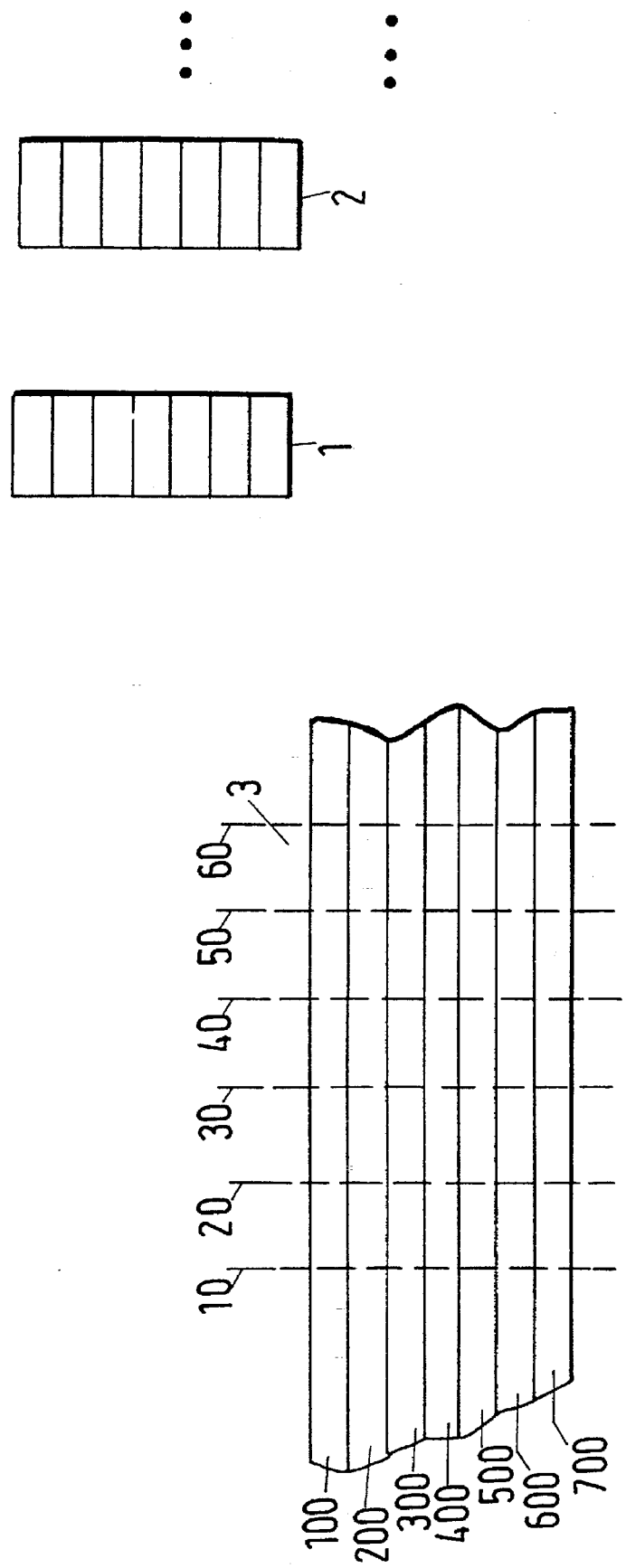
FIG. 1, is a schematic depiction of the method according to the invention for producing vertically structured microsystems.

FIG. 1 is a simplified schematic depiction of the method according to the invention. In this exemplary embodiment, seven wafers 100–700, each carrying specific elements of a certain microsystem are stacked in contact with one another. For instance, individual wafers may carry micromechanical adjusting elements (actuators), optical components (laser-active media, mirrors, imaging systems), sensors (photo diodes, temperature, pressure sensors, etc.), electronic components (diodes, transistors, integrated circuits for triggering the components, evaluating the sensors and deriving a control signal), cooling systems (regulated microcoolers), or a combination of such elements. Preferably the structures carried by the wafers 100 to 700 are such that that on the one hand they can readily be produced in the particular substrate used, and on the other they can be structured in similar processing methods. Electrical contacts can also be produced essentially in the wafers.

The different wafers, may be made of the known semiconductor materials or other substrates such as glass, quartz or crystal, which can be fabricated in wafer form. After being structured, the wafers, each containing an array of microsystem elements, are adjusted as a unit relative to one another (using optical or mechanical positioning aids, for instance), contacted to one another by the usual methods (bonding, optical contacting), and cut along the planes (10, 20, 30, etc.), so that finally the result is preferably vertical structures 1, 2, which represent complete microsystems with complex functions. If cutting apart of the wafers is omitted, then a generally flat array of microsystems is created, each functioning parallel to and independently of one another.

Figure 2:
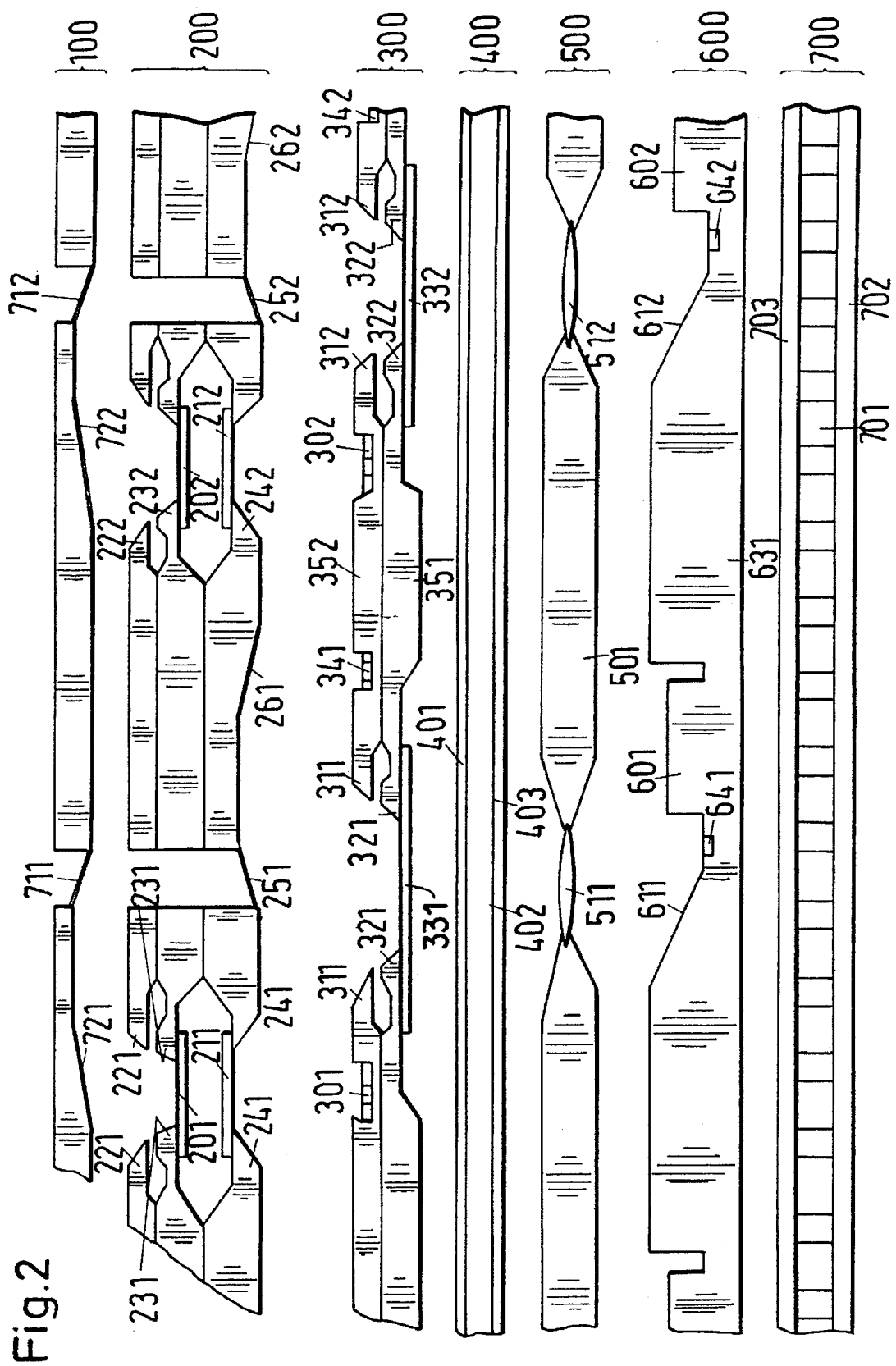
FIG. 2, is a schematic diagram of an exemplary embodiment of the invention for forming a microsystem solid-state laser in an exploded view designating the various system functions.

FIG. 2 illustrates an exemplary embodiment of a microsystem solid-state laser. In the present case, this laser comprises a solid-state crystal pumped by laser diodes; the laser diode beam is focused into a crystal disk via a coupling optical element 711, 712; the solid-state laser is regulated in its output capacity and is tunable in its frequency, and in the final analysis is stabilized to a reference cavity. The heat load induced by the laser diodes 641, 642 is dissipated from the system from the microchannel coolers 701, 702. FIG. 2 shows a detail of a wafer arrangement of this kind; typically, however, a wafer includes a number of such elements, as will be described in detail hereinafter, but only two of which have been shown in the drawing for the sake of simplicity.

In this exemplary embodiment, the wafer 700 contains the microcooler. This wafer itself may comprise a silicon substrate 702, into which cooling channels 701 are etched that are closed in flat fashion by a second plane wafer 703. The flow through such a microcooler can be regulated by integrated microvalves for instance.

This wafer 700 is adjoined by the wafer 600, which is made from a gallium arsenide substrate 631, for instance. The pump laser diodes 601, 602 are monolithically integrated into it. By anisotropic etching and optionally by optical vapor deposition, beam deflector elements 611, 612 which deflect the horizontally emitted laser diode beam to the vertical are integrated. Laser diodes 641, 642, which serve as temperature sensors for the laser diode temperature and from which a control signal for the cooling can be derived, are structured near the laser diodes 601, 602.

The wafer 500 adjoining that includes an imaging optical element 511, 512 for focusing the pump laser beam into the laser crystal. The respective lens 511, 512 is shaped by forming of the silicon substrate 501 for infrared wavelengths at which silicon is transparent; for other wavelengths, however, it may also comprise integrated glass lenses or glass beads, or may be embodied as a holographic optical element. In this last case, preferably glass in which a phase grating is inscribed by etching processes, and which has the imaging capabilities of a lens system, is then used as the substrate 501. In certain cases, the wafer 500 may also be omitted.

The adjoining wafer 400 comprises a laser crystal or laser glass. The polished laser-active layer 402, doped with ions of the lanthanide group, is optically coated on both sides, specifically in such a way that the layer 403 acts as an optical low-pass filter, which is highly transmissive for the pump light wavelength of the laser diode and highly reflective for the solid-state laser wavelength. The coating 401 is embodied as an antireflection coating for the laser wavelength and is optionally reflective for the pump light wavelength.

The wafer 300 essentially contains actively controlled laser mirrors 331, 332 for the solid-state laser, which essentially comprise a mirror coating which is partially reflective for the laser wavelength and is vapor-deposited onto a silicon substrate 351, for example, and embodied as a transmission mirror. Moreover, for active motion of each mirror 331, 332, a respective micromechanical actuator 311, 321 and 312, 322 is provided. This wafer 300 can in turn, for the sake of suitable embodiment of the actuator elements, be composed of two joined-together substrates 351 and 352, with photo diodes 341, 342 and 301, 302 further being let into the upper substrate. The first two of these form sensors for measuring the laser output, and the last two form sensors for active frequency stabilization of the laser.

Between wafer 400 and wafer 300, further wafers with intercavity elements can also be provided, examples being nonlinear optical crystals for frequency multiplication, phase modulation, etc.

The further wafer 200 in the exemplary embodiment contains a beam deflector for decoupling a partial beam of low intensity, which is deflected onto the photo diodes 341, 342 of the wafer 300 in order to measure the output, and a reference cavity for frequency stabilization of the laser. The beam deflector is formed by a partially reflective transmission mirror 251, 252 and a highly reflective mirror coating 261, 262, which is applied to the obliquely etched substrate, so that a reflection of the partial beam takes place in the desired direction. In principle, a beam deflector can be formed in some other way as well, for instance by means of a holographic grating that reflects a partial beam of low intensity in the first order, or by suitably shaped integrating optics (waveguide structures).

The reference cavity of each system comprises two mirror coatings 211, 201, the latter being moved actively via the actuator elements 231, 221, while the coating 211 conversely is rigidly joined to the substrate 241. The transmission frequency of the thus-formed resonator can be modulated by the micromechanical actuators, and from that an error signal can be derived for triggering the laser mirror 301 of the wafer 300. It should be noted here that naturally the electronics can also be structured jointly into the substrates; that is, intelligent sensor evaluation and control signal generation can be achieved "on the chip" with the actuators and sensors.

Finally, the wafer 100 has a beam deflector, formed of the partially reflective transmission mirrors 711, 712 and the highly reflective reflection mirrors 721, 722, which is embodied analogously to the beam deflector elements of the wafer 200 for decoupling a partial beam of low intensity of the solid-state laser for passage through the reference cavity of the wafer 200 and for ensuing detection in the photo diode 301 of the wafer 300.

Figure 3:
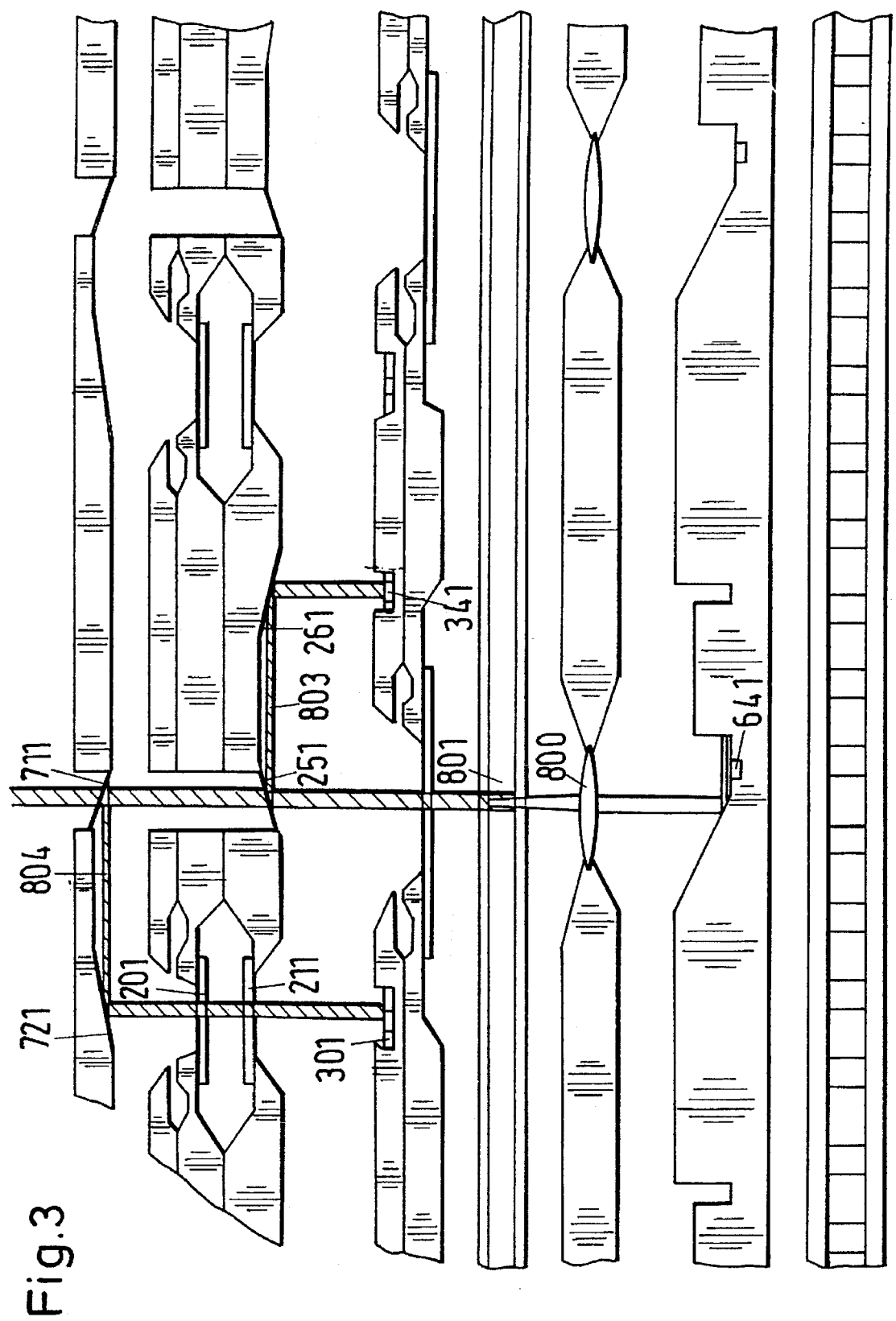
FIG. 3, is an exploded view of the exemplary embodiment of FIG. 2 with the beam path of the laser system shown.

With the same layout as the exemplary embodiment described above, FIG. 3 shows the optical beam path. The laser diode beam (shown in dotted lines) is focused via an imaging element 800 into solid-state crystal 801, which is vapor-deposited on one side reflectively for the laser wavelength and thus forms a laser-active resonator, together with a discrete, micromechanically movable laser mirror 802. This can be described as a semimonolithic laser layout. A first partial beam 803 of the laser is decoupled and aimed via deflector elements 251, 261 onto the photo diode 341, for measurement of the laser output.

A further partial beam 804 is aimed by a tunable reference cavity, whose transmission maximum is modulated by active movement of one of the two resonator mirrors, and from which by detection of a second photo diode 301, an error signal is derived for frequency stabilization of the solid-state laser by active movement of the laser mirror.

Figure 4:
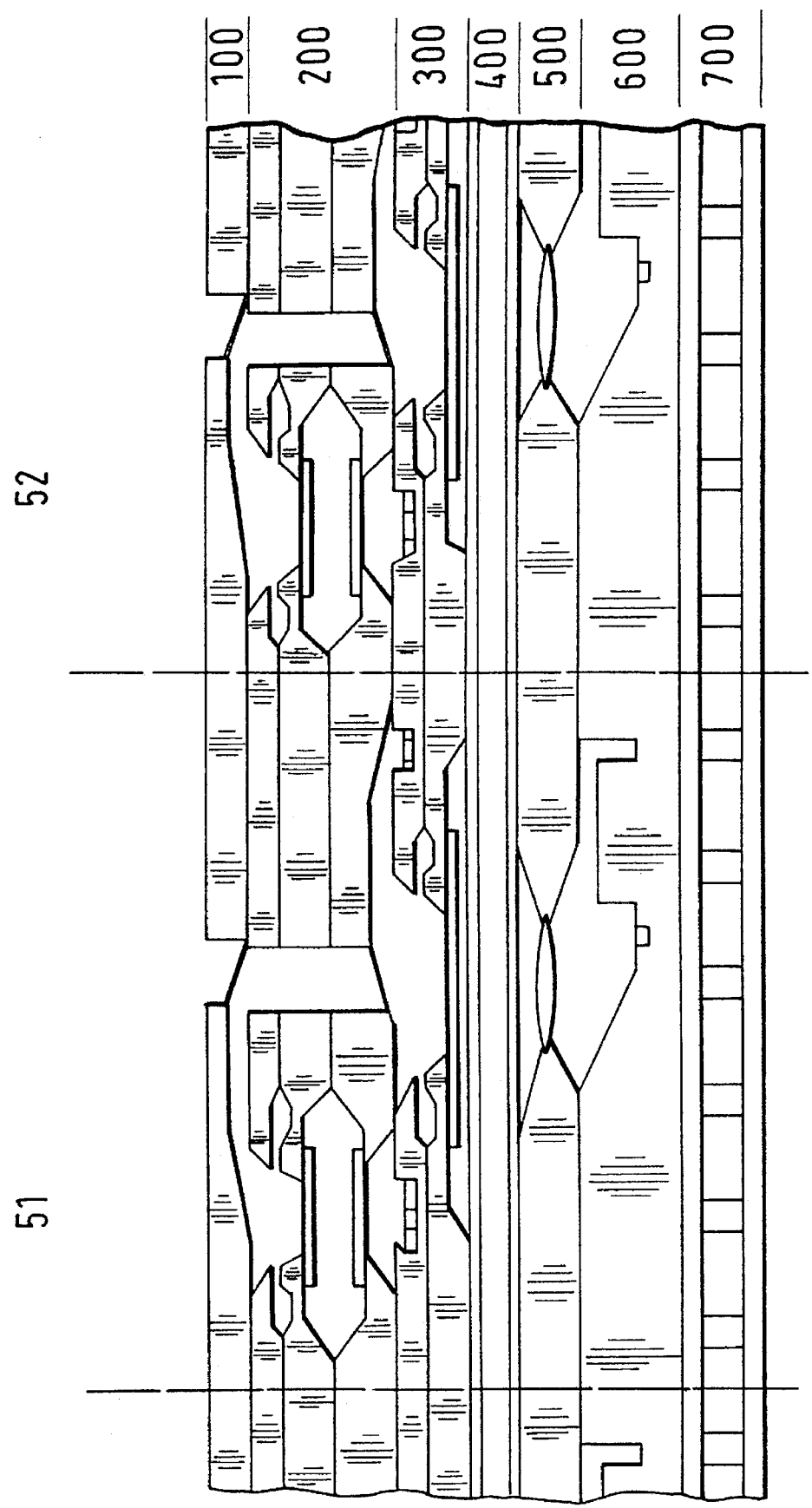
FIG. 4, is a schematic illustration of the exemplary embodiment of FIG. 2 realistically showing the contacting of the various wafers—which embody specific functions.

In FIG. 4, the layout is shown similarly to the exploded view of FIG. 2. Here, the wafers 100–700 are shown in their positioned, contacted position relative to one another. The possible interfaces are also shown, along which the individual microlaser systems can be cut apart. If cutting them apart is dispensed with, then a generally flat arrangement of microlaser systems controllable independently of one another can be formed.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Method of making an optical microsystem by means of microelectronic, micromechanical and microoptical techniques, comprising the steps of:

providing a plurality of differently structured wafers made from one of semiconductor, quartz or crystal material, each of said wafers having an array containing a plurality of at least a particular microcomponent of said microsystem, and at least some of said wafers having apertures therein, wherein said wafer material is removed;

positioning said wafers in a desired relative alignment of said respective microcomponents of said microsystem wherein said apertures are aligned to form at least an optical path in said microsystem, by means of optical, mechanical or electrical positioning aids integrated on said wafers;

joining said wafers in said desired alignment, thereby creating an array of optical microsystems whose respective microcomponents are coupled in communication with each other, aligned and stacked along axes which are substantially normal to said wafers.

2. Method according to claim 1 further comprising the step of cutting said wafers at defined interfaces between said microsystems, whereby a plurality of separate microsystems are formed.

3. Method according to claim 1 wherein said microcomponents include electrooptical components defining said at least an optical path, and wherein said desired relative alignment of microcomponents of said microsystem is such that said micro-components on said wafers are coupled in communication to form a functional microsystem, with connecting faces of said wafers situated outside said optical path.

4. Method according to claim 1 further comprising the step of cutting said wafers at defined interfaces between said microsystems, whereby a plurality of separate microsystems are formed.

5. An optical microsystem including a plurality of electronic, mechanical or optical microcomponents comprising:

a plurality of differently structured wafers made from semiconductor, quartz or crystal material, each of said wafers having an array containing a plurality of at least a particular microcomponent of said microsystems, and at least some of said wafers having apertures therein, wherein said wafer material is removed;

wherein said wafers are joined to form a stack of wafers, with wafers in said stack being positioned with respective microcomponents of said microsystems aligned in a predetermined manner with said apertures aligned to form at least an optical path in said microsystem; and wherein said microcomponents are coupled in communication with each other, aligned and stacked along axes which are substantially normal to a surface of said wafers, thereby forming said array of electronic, mechanical or optical microsystems.

6. Microsystem according to claim 5 wherein said microcomponents include electrooptical components defining said at least an optical path, and wherein said desired relative alignment of microcomponents of said microsystem is such that said microcomponents on said wafers are coupled in communication to form a functional microsystem, with connecting faces of said wafers situated outside said optical path.

* * * * *